US011482919B2

(12) United States Patent
Lai et al.

(10) Patent No.: US 11,482,919 B2
(45) Date of Patent: Oct. 25, 2022

(54) GATE DRIVE APPARATUS AND CONTROL METHOD FOR SWITCHED CAPACITOR CONVERTER

(71) Applicant: Halo Microelectronics International, Campbell, CA (US)

(72) Inventors: Suming Lai, San Diego, CA (US); Kenneth Chung-Yin Kwok, Irvine, CA (US)

(73) Assignee: Halo Microelectronics International, Campbell, CA (US)

( * ) Notice: Subject to any disclaimer, the term of this patent is extended or adjusted under 35 U.S.C. 154(b) by 107 days.

(21) Appl. No.: 17/208,605

(22) Filed: Mar. 22, 2021

(65) Prior Publication Data

US 2022/0131456 A1    Apr. 28, 2022

Related U.S. Application Data

(60) Provisional application No. 63/106,730, filed on Oct. 28, 2020.

(51) Int. Cl.
*H02M 3/07* (2006.01)
*H02M 1/088* (2006.01)
*H02J 7/34* (2006.01)
*H02J 7/06* (2006.01)
*H02H 7/12* (2006.01)
*H02M 1/00* (2006.01)

(52) U.S. Cl.
CPC .......... *H02M 1/088* (2013.01); *H02H 7/1213* (2013.01); *H02J 7/06* (2013.01); *H02J 7/345* (2013.01); *H02M 3/07* (2013.01); *H02J 2207/20* (2020.01); *H02M 1/0012* (2021.05)

(58) Field of Classification Search
CPC ...... H02M 1/088; H02M 1/0012; H02M 3/07; H02M 3/076; H02H 7/1206; H02J 7/06; H02J 7/345
See application file for complete search history.

(56) References Cited

U.S. PATENT DOCUMENTS

| 2013/0249520 A1* | 9/2013 | Oikarinen | H02M 3/157 |
| | | | 323/285 |
| 2014/0232454 A1* | 8/2014 | Gillberg | H02M 3/1588 |
| | | | 327/540 |
| 2016/0315539 A1* | 10/2016 | Lee | H02M 1/088 |
| 2019/0348901 A1* | 11/2019 | Chen | H02M 1/088 |

* cited by examiner

*Primary Examiner* — Nguyen Tran
(74) *Attorney, Agent, or Firm* — Slater Matsil, LLP (57) ABSTRACT

An apparatus includes a first gate drive transistor and a second gate drive transistor connected in series, a common node of the first gate drive transistor and the second gate drive transistor connected to a gate of a power switch, the second gate drive transistor configured as a bulk switch having a bulk terminal connected to a bulk terminal of the power switch, a first auxiliary transistor connected between the bulk terminal and a source of the power switch, a second auxiliary transistor coupled between the gate of the power switch and a system ground, and a third auxiliary transistor coupled between a logic control ground and the system ground, wherein the second auxiliary transistor and the third auxiliary transistor are configured to pull the gate of the power switch and the logic control ground down to the system ground in response to a turn off of the apparatus.

20 Claims, 7 Drawing Sheets

GATE DRIVE APPARATUS AND CONTROL METHOD FOR SWITCHED CAPACITOR CONVERTER

This application claims the benefit of U.S. Provisional Application No. 63/106,730, filed on Oct. 28, 2020, entitled "Gate Drive Apparatus and Control Method for Switched Capacitor Converter," which application is hereby incorporated herein by reference.

TECHNICAL FIELD

The present invention relates to a gate drive apparatus, and, in particular embodiments, to a gate drive apparatus for a switched capacitor converter.

BACKGROUND

As technologies further advance, a variety of portable devices, such as mobile phones, tablet PCs, digital cameras, MP3 players and/or the like, have become popular. Each portable device may employ a plurality of rechargeable battery cells. The plurality of rechargeable battery cells may be connected in series or in parallel so as to form a rechargeable battery pack for storing electrical energy.

As power consumption has become more important, there may be a need for reducing the length of time to charge the battery. Fast charging has emerged as a veritable solution to satisfy the ever changing demand from consumers. In a fast charging system, a switched capacitor converter is employed to deliver high current to the battery while keeping the input current (e.g., USB cable current) low. The switched capacitor converter has various advantages such as monolithic integration of the converter without external inductors, high power conversion efficiency and the like. The switched capacitor converter is capable of achieving a safe and quick charging of large-capacity batteries.

The switched capacitor converter includes a plurality of switches connected in series between an input power source and ground. The switches not connected to ground are commonly known as high-side switches, and the switch connected to ground is commonly known as a low-side switch. A low-side driver circuit and a plurality of high-side drive circuits are employed to control the gates of the low-side switch and the high-side switches, respectively. The bias supply of the low-side driver circuit is supplied from a regulated bias voltage source. The high-side drive circuits may need a gate voltage higher than the voltage of the input power source.

SUMMARY

These and other problems are generally solved or circumvented, and technical advantages are generally achieved, by preferred embodiments of the present disclosure which provide a gate drive apparatus and method for a switched capacitor converter.

In accordance with an embodiment, an apparatus comprises a first gate drive transistor and a second gate drive transistor connected in series, a common node of the first gate drive transistor and the second gate drive transistor being connected to a gate of a power switch, the second gate drive transistor being configured as a bulk switch having a bulk terminal connected to a bulk terminal of the power switch, a first auxiliary transistor connected between the bulk terminal and a source of the power switch, a second auxiliary transistor coupled between the gate of the power switch and a system ground, and a third auxiliary transistor coupled between a logic control ground and the system ground, wherein the second auxiliary transistor and the third auxiliary transistor are configured to pull the gate of the power switch and the logic control ground down to the system ground in response to a turn off of the apparatus.

In accordance with another embodiment, a method comprises after enabling the driver, connecting a source of the power switch to a logic control ground of the driver, and connecting a bulk terminal of the power switch to the source of the power switch, and after disabling the driver, disconnecting the source of the power switch from the logic control ground of the driver, and disconnecting the bulk terminal of the power switch from the source of the power switch.

In accordance with yet another embodiment, a system comprises a switched capacitor converter, and a driver configured to drive a third switch of the switched capacitor converter, wherein the driver comprises a first gate drive transistor and a second gate drive transistor connected in series, a common node of the first gate drive transistor and the second gate drive transistor being connected to a gate of the third switch, the second gate drive transistor being configured as a bulk switch having a bulk terminal connected to a bulk terminal of the third switch, a first auxiliary transistor connected between the bulk terminal and a source of the third switch, a second auxiliary transistor coupled between a gate of the third switch and a system ground, and a third auxiliary transistor coupled between a logic control ground and the system ground, wherein the second auxiliary transistor and the third auxiliary transistor are configured to pull the gate of the third switch and the logic control ground down to the system ground in response to a turn off of the driver.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a gate drive apparatus for a switched capacitor converter. The invention may also be applied, however, to a variety of power converters. Hereinafter, various embodiments will be explained in detail with reference to the accompanying drawings.

Figure 1:
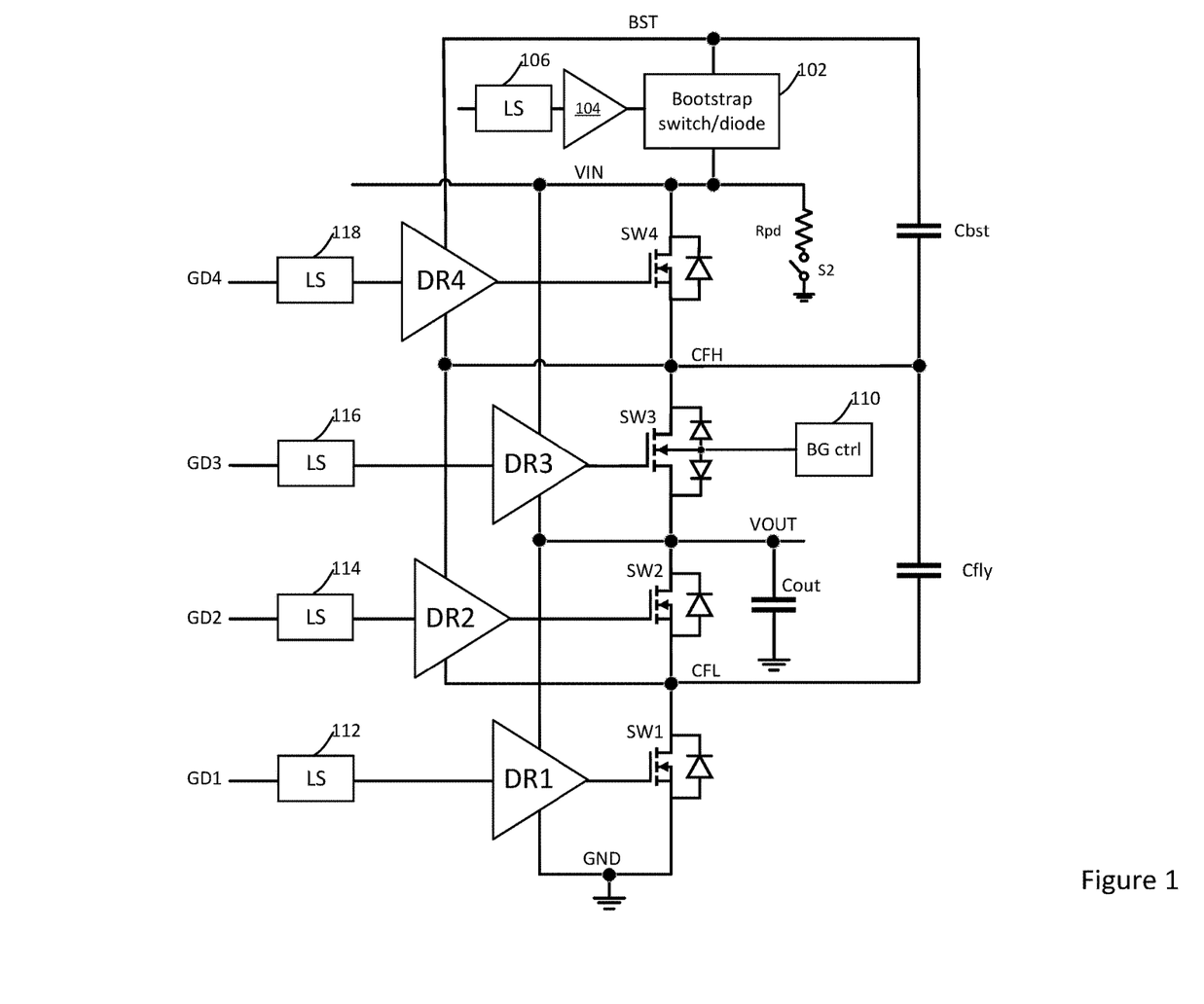
FIG. 1 illustrates a schematic diagram of a switched capacitor converter in accordance with various embodiments of the present disclosure.

FIG. 1 illustrates a schematic diagram of a switched capacitor converter in accordance with various embodiments of the present disclosure. The switched capacitor converter has an input coupled to an input voltage bus VIN, and an output coupled to an output voltage bus VOUT. As shown in FIG. 1, an input voltage bus discharge circuit is connected between the input voltage bus VIN and ground. The input voltage bus discharge circuit comprises a resistor $R_{pd}$ and a switch S2 connected in series. The input voltage bus discharge circuit is employed to discharge the input voltage bus VIN so that the voltage on the input voltage bus VIN is close to zero volts after the switched capacitor converter has been turned off. This ensures that at the beginning of the next power-up, the voltage on the input voltage bus VIN is approximately equal to zero.

As shown in FIG. 1, the switched capacitor converter comprises a first switch SW1, a second switch SW2, a third switch SW3 and a fourth switch SW4 connected in series between ground (GND) and the input voltage bus VIN. The common node of switches SW2 and SW3 is connected to the output voltage bus VOUT. A load such as a battery is connected between the output voltage bus VOUT and GND. Throughout the description, the GND shown in FIG. 1 may be alternatively referred to as a system ground.

As shown in FIG. 1, each switch has a dedicated driver. In particular, a first gate drive signal GD1 is fed into a first driver DR1 through a first level shifter 112. The output of the first driver DR1 is connected to the gate of the first switch SW1. A second gate drive signal GD2 is fed into a second driver DR2 through a second level shifter 114. The output of the second driver DR2 is connected to the gate of the second switch SW2. A third gate drive signal GD3 is fed into a third driver DR3 through a third level shifter 116. The output of the third driver DR3 is connected to the gate of the third switch SW3. A fourth gate drive signal GD4 is fed into a fourth driver DR4 through a fourth level shifter 118. The output of the fourth driver DR4 is connected to the gate of the fourth switch SW4.

As shown in FIG. 1, a positive terminal of each driver is connected to a drain of an adjacent upper switch. For example, the positive terminal of the second driver DR2 is connected to the drain of the third switch SW3. For the fourth switch SW4, it does not have an adjacent upper switch. The positive terminal of the fourth driver DR4 is connected to a positive terminal of the bootstrap capacitor Cbst. The bootstrap capacitor Cbst is connected between a voltage bus BST and the node CFH. The bootstrap voltage on the bootstrap capacitor Cbst is established through a bootstrap circuit comprising a level shifter 106, a driver 104 and a bootstrap switch/diode apparatus 102. The bootstrap switch/diode apparatus 102 comprises a bootstrap switch or a bootstrap diode configured to charge the bootstrap capacitor Cbst. The bootstrap capacitor is configured to provide bias power to a high-side driver (e.g., the driver for SW4). The bootstrap circuit is well known in the art, and hence is not discussed in detail herein.

The switched capacitor converter further comprises a flying capacitor Cfly and an output capacitor Cout. The flying capacitor Cfly is connected between a common node (CFH) of switches SW3 and SW4, and a common node (CFL) of switches SW1 and SW2. An active discharge circuit (not shown) is connected in parallel with the flying capacitor. The active discharge circuit is employed to discharge the voltage across the flying capacitor after the switched capacitor converter has been turned off.

The output capacitor Cout is connected between the output voltage bus VOUT and the system ground. The output capacitor Cout is in parallel with the load.

In some embodiments, the third switch SW3 is implemented as an isolation switch. In particular, the third switch SW3 provides isolation between the load (e.g., a battery) and an input power source (e.g., a charging source). As shown in FIG. 1, the bulk terminal of the third switch SW3 is not connected to the source of the third switch SW3. The third switch SW3 includes two diodes. A first diode is between the bulk terminal and the source. A second diode is between the bulk terminal and the drain. These two diodes are back-to-back connected. As a result of having the back-to-back connected diodes, the third switch SW3 functions as an isolation switch. After a turn-off signal is applied to the gate of the third switch SW3, the third switch SW3 can provide isolation between the output voltage bus VOUT and the node CFH. More particularly, when the node CFH is shorted to ground, the third switch SW3 prevents excessively high current from being drawn from the load (e.g., a battery) coupled to the output voltage bus VOUT.

As shown in FIG. 1, a bulk control circuit 110 is connected to the common node of the two back-to-back connected diodes. The bulk control circuit 110 is employed to control the characteristics of the channel of the third switch SW3 through adjusting the voltage potential at the bulk terminal of SW3. In some embodiments, the bulk control circuit 110 is configured to pull the bulk terminal of the third switch SW3 down to ground when the switched capacitor converter is in an off state. When the switched capacitor converter is ready to be turned on, and prior to toggling of the gate terminal of each of the four power switched mentioned above, the bulk terminal of the third switch SW3 will be connected to the source of the third switch SW3 through a switch (e.g., PM3 shown in FIG. 3).

In accordance with an embodiment, the switching elements of FIG. 1 may be metal oxide semiconductor field-effect transistor (MOSFET) devices. Alternatively, the switching element can be any controllable switches such as insulated gate bipolar transistor (IGBT) devices, integrated gate commutated thyristor (IGCT) devices, gate turn-off thyristor (GTO) devices, silicon controlled rectifier (SCR) devices, junction gate field-effect transistor (JFET) devices, MOS controlled thyristor (MCT) devices, gallium nitride (GaN) based power devices, silicon carbide (SiC) based power devices and the like.

It should be noted while FIG. 1 shows the switches SW1, SW2, SW3 and SW4 are implemented as single n-type transistors, a person skilled in the art would recognize there may be many variations, modifications and alternatives. For example, depending on different applications and design needs, all or at least some of the switches SW1, SW2, SW3 and SW4 may be implemented as p-type transistors. Furthermore, each switch shown in FIG. 1 may be implemented as a plurality of switches connected in parallel. Moreover, a capacitor may be connected in parallel with one switch to achieve zero voltage switching (ZVS)/zero current switching (ZCS).

In operation, the switched capacitor converter operates in two different phases. In a first phase, the switches SW4 and SW2 are turned on and switches SW3 and SW1 are turned off. As a result of turning on SW4 and SW2, the input voltage VIN charges the flying capacitor Cfly and the output capacitor Cout. In the first phase, the flying capacitor Cfly and the output capacitor are connected in series. In a second phase, the switches SW3 and SW1 are turned on, and switches SW4 and SW2 are turned off. As a result of turning on SW3 and SW1, the flying capacitor Cfly is connected in parallel with the output capacitor Cout, and the energy stored in the flying capacitor Cfly and the output capacitor is discharged to the load (e.g., a battery connected in parallel with Cout).

Figure 2:
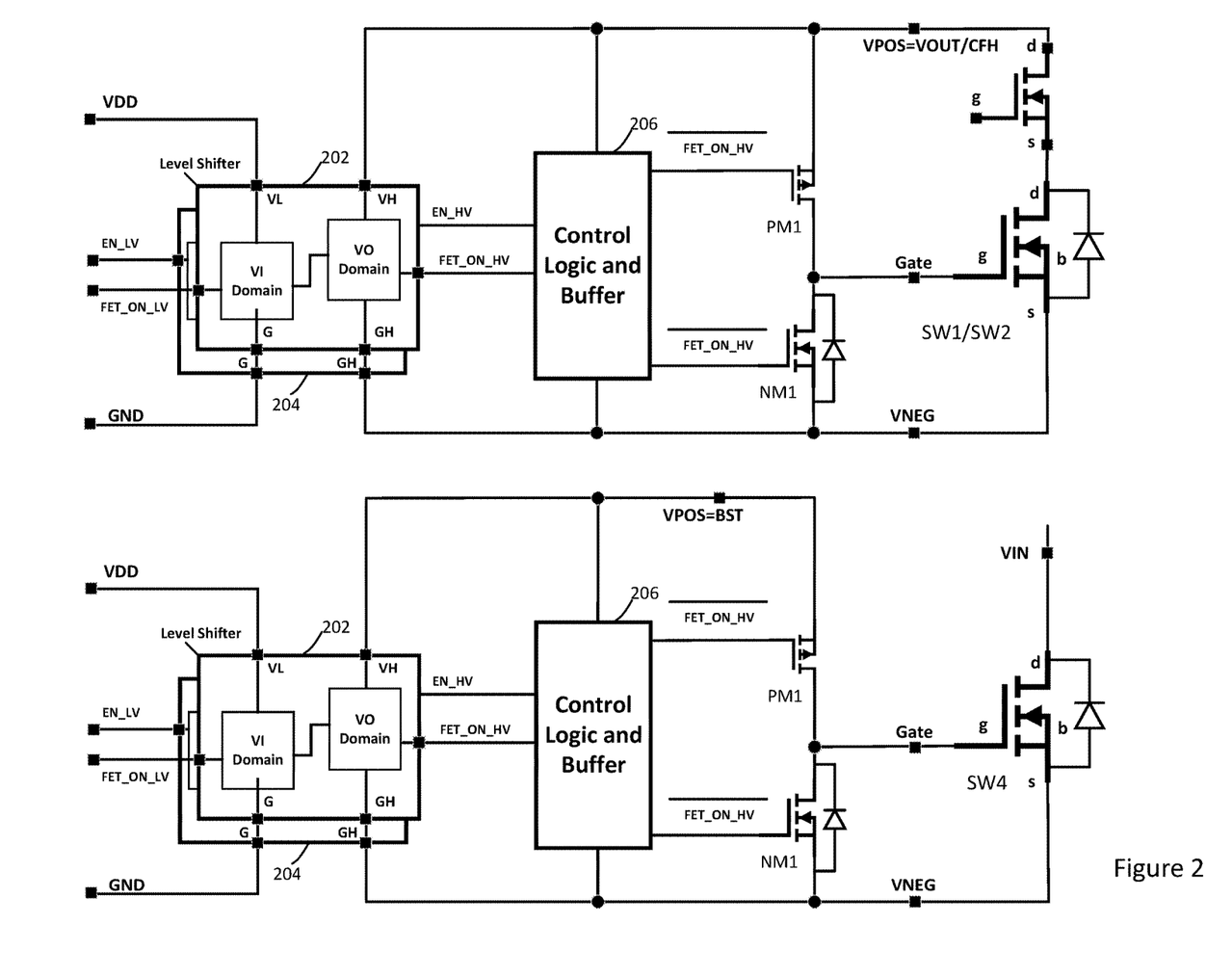
FIG. 2 illustrates a first implementation of the gate driver the switched capacitor converter shown in FIG. 1 in accordance with various embodiments of the present disclosure.

FIG. 2 illustrates a first implementation of the gate driver of the switched capacitor converter shown in FIG. 1 in accordance with various embodiments of the present disclosure. The gate driver shown in FIG. 2 may be employed to drive switches SW1, SW2 and SW4 shown in FIG. 1. In particular, the gate driver in the upper portion of FIG. 2 is employed to drive switches SW1 and SW2. The gate driver in the lower portion of FIG. 2 is employed to drive switch SW4. The gate drivers of these two portions are similar except that the drain of SW4 is not connected with a switch, and the BST node is used to provide power for the driver of SW4. For simplicity, only the gate driver in the upper portion of FIG. 2 is described in detail. As shown in FIG. 2, the gate driver comprises a p-type transistor PM1, an n-type transistor NM1, a control logic unit 206 and a group of level shifters 202, 204. Each of the group of level shifters has four voltage terminals, namely VL, G, VH and GH. As shown in FIG. 2, VL is connected to a bias voltage VDD (e.g., a 5 V bias voltage). G is connected to ground. VH is connected to a first voltage bus VPOS. GH is connected to a second voltage bus VNEG.

As shown in FIG. 2, each of the group of level shifters is configured to receive an enable signal EN_LV and a gate drive signal FET_ON_LV. Through the well known level shifting technique, the group of level shifters is employed to translate control signals from a low-voltage domain (e.g., a voltage domain formed by VDD and GND) to the power MOSFET gate driver domain (e.g., a voltage domain formed by VPOS and VNEG).

As shown in FIG. 2, the enable signal EN_LV and the gate drive signal FET_ON_LV are converted into an enable signal EN_HV and a gate drive signal FET_ON_HV in a gate drive voltage domain. The enable signal EN_HV and the gate drive signal FET_ON_HV are fed into the control logic unit 206. The control logic unit 206 comprises a series of logic buffers for driving PM1 and NM1. The control logic unit 206 further comprises a circuit for generating the inverse version ($\overline{\text{FET\_ON\_HV}}$) of the FET_ON_HV signal.

The p-type transistor PM1 and the n-type transistor NM1 are connected in series between the first voltage bus VPOS and the second voltage bus VNEG. The common node of the p-type transistor PM1 and the n-type transistor NM1 is configured to generate a gate drive signal applied to the gate of the power MOSFET (e.g., switches SW1 and SW2).

The transistor PM1 functions as a pull-up transistor. The transistor PM1 is able to pull the gate voltage up to VPOS. The transistor NM1 functions as a pull-down transistor. The transistor NM1 is able to pull the gate voltage down to VNEG.

As shown in FIG. 2, in the power MOSFET gate driver domain, VNEG is connected to the source node of the power MOSFET. VNEG may be alternatively referred to as a ground net of the gate driver domain. VPOS is connected to a node whose voltage is stable and higher than VNEG. In some embodiments, VPOS is connected to the drain of an adjacent high-side power MOSFET in the switched capacitor converter. For example, if the power MOSFET is SW1 shown in FIG. 1, then VPOS is connected to the drain of SW2. If the power MOSFET is SW4, which does not have a high-side power MOSFET, VPOS of the corresponding driver is connected to the BST node of the bootstrap capacitor as shown in FIG. 1. The voltage on the BST node is charged and maintained at a voltage level equal to about VIN-VOUT.

The gate driver shown in FIG. 2 is not suitable for driving SW3. There may be at least two reasons. First, when the power MOSFET is turned off, NM1 in in FIG. 2 is turned on. The turned on NM1 connects the gate of the power MOSFET to VNEG. This connection between the gate of the power MOSFET and VNEG cannot fully turn off SW3 because SW3 is reversely conducting. In particular, when the switched capacitor converter is in the off-state, the input voltage bus VIN is discharged to 0 V. Referring back to FIG. 1, the voltage on the node CFH is clamped to a voltage level of about 0 V plus a diode forward voltage drop (the body diode drop of SW4). The gate of SW3 is connected to the output voltage bus VOUT. The output voltage bus is connected to a battery. The battery voltage is in a range from about 2.6 V to about 4.6 V. The drain voltage is tied to CFH, which is equal to a diode forward voltage (about 0.6 V). As such, the gate voltage of SW3 is greater than the drain voltage of SW3. As a result of having this drain and gate voltage relationship, SW3 is reversely conducting. Second, the body diode of NM1 clamps the gate of SW3 to a voltage level about VOUT minus a diode forward voltage drop. Hence, the gate voltage of SW3 is much higher than the voltage on the node CFH. Since the gate voltage of SW3 is higher than the drain voltage of SW3, the control circuit cannot turn off SW3.

The two reasons described above can be overcome by the gate drivers discussed below with respect to FIGS. 3-4.

Figure 3:
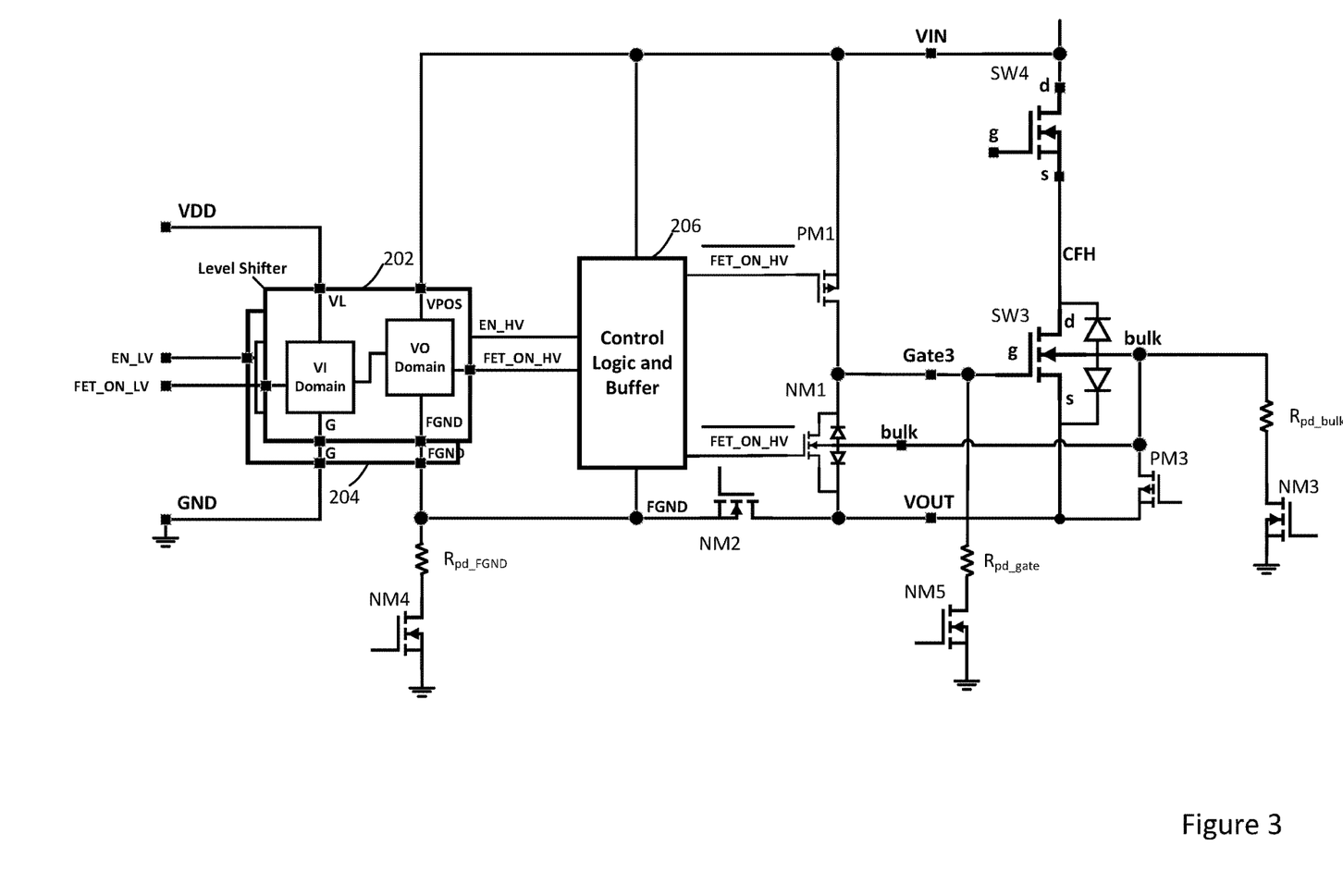
FIG. 3 illustrates a second implementation of the gate driver of the switched capacitor converter shown in FIG. 1 in accordance with various embodiments of the present disclosure.

FIG. 3 illustrates a second implementation of the gate driver of the switched capacitor converter shown in FIG. 1 in accordance with various embodiments of the present disclosure. The gate driver comprises a p-type transistor PM1, an n-type transistor NM1, a control logic unit 206, a group of level shifters 202, 204 and transistors NM3, PM3, NM2, NM4 and NM5.

The p-type transistor PM1 and the n-type transistor NM1 are connected in series between the input voltage bus VIN and the output voltage bus VOUT. The common node of the p-type transistor PM1 and the n-type transistor NM1 is configured to generate a gate drive signal applied to the gate of the switch SW3. The control logic unit 206 has a first bias terminal (e.g., bias voltage) connected to VIN and a second bias terminal (e.g., logic control ground) connected to FGND. FGND may be alternatively referred to as a control logic ground net or a control logic ground.

PM1, the control logic unit 206 and the group of level shifters 202, 204 have been discussed above with respect to FIG. 2, and hence are not discussed again herein. The transistor NM1 is implemented as a bulk switch as shown in FIG. 3. The structure of the transistor NM1 is similar to that of SW3. The bulk terminal of NM1 is connected to the bulk terminal of SW3. As shown in FIG. 3, PM3 is connected between the bulk terminal of SW3 and the source of SW3. When the switched capacitor converter is ready to be turned on, and prior to powering up the switched capacitor converter, the bulk terminal of SW3 will be connected to the source of SW3. As shown in FIG. 3, PM3 is used to implement this function. After receiving a disable signal (e.g., a falling edge of EN_LV) or detecting a system fault, the gate driver is disabled and the switched capacitor converter is turned off, PM3 is turned off. As a result of turning off PM3, the bulk terminal of SW3 is disconnected from the source of SW3.

A resistor $R_{pd\_gate}$ and NM5 are connected in series between the gate of SW3 and the system ground. NM2 is connected between VOUT and the control logic ground FGND. A resistor $R_{pd\_FGND}$ and NM4 are connected in series between the control logic ground FGND and the system ground.

As shown in FIG. 3, the bulk terminal of NM1 is connected to the bulk terminal of SW3. Such a connection eliminates the diode clamp path described in the second reason above. Furthermore, as shown in FIG. 3, the source and the bulk terminal of NM2 are connected together. NM2 functions as a switch that separates the control logic ground FGND of the control logic unit 206 from VOUT. As shown in FIG. 3, VOUT is connected to the source of NM1. In some embodiments, NM2 is controlled by the enable signal EN_HV. When the enable signal EN_HV goes high (e.g., EN_HV connected to VIN), NM2 is turned on. On the other hand, when EN_HV goes low (e.g., EN_HV connected to VOUT), NM2 is turned off. NM2 is used to separate FGND from VOUT when SW3 is turned off.

In some embodiments, when a turn-off signal is applied to the switched capacitor converter, the enable signal EN_LV goes to 0 V. EN_LV functions as a disable signal applied to the gate driver. This disable signal turns on NM4. The turned on NM4 and $R_{pd\_FGND}$ pull the voltage on FGND down to the system ground. In addition, this disable signal also turns on NM5. The turned on NM5 and $R_{pd\_gate}$ pull the gate of SW3 to the system ground. Furthermore, this disable signal also turns on NM3. The turned on NM3 and $R_{pd\_bulk}$ pull the bulk terminal of SW3 to the system ground.

NM2, NM4 and NM5 pull the gate of SW3 down to the system ground. The gate voltage of SW3 is lower than the drain voltage of SW3. SW3 can be fully turned off. This circuit solves the problem described in the first reason above.

Figure 4:
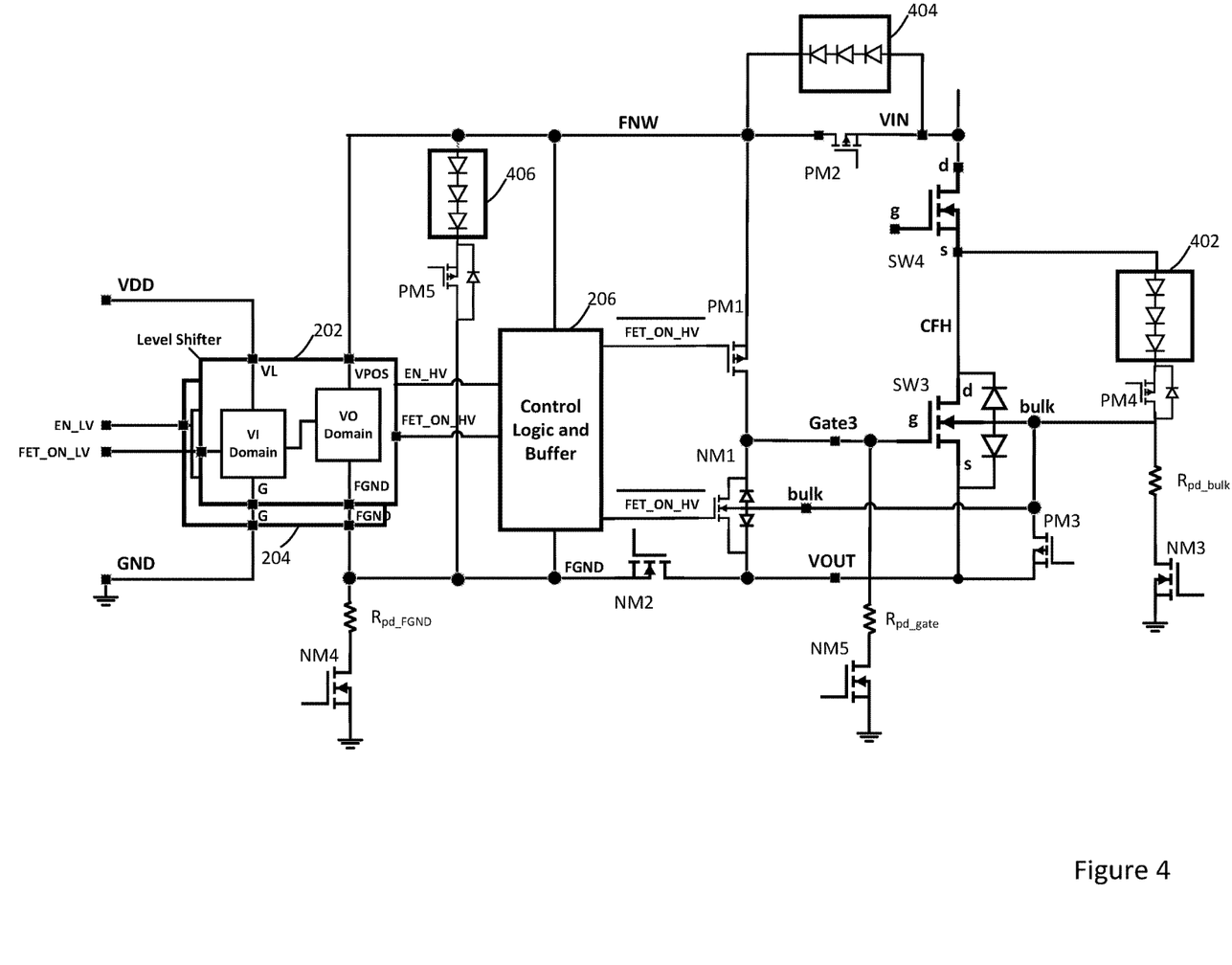
FIG. 4 illustrates a third implementation of the gate driver of the switched capacitor converter shown in FIG. 1 in accordance with various embodiments of the present disclosure.

FIG. 4 illustrates a third implementation of the gate driver of the switched capacitor converter shown in FIG. 1 in accordance with various embodiments of the present disclosure. The gate driver shown in FIG. 4 is similar to that of FIG. 3 except that three voltage clamping circuits 402, 404 and 406 have been employed to reduce voltage stresses.

Referring back to FIG. 3, the devices in the level shifter, the control logic unit, the buffer, and PM1 have a voltage stress equal to VIN minus GND (the system ground). Three voltage clamping circuits 402, 404 and 406 have been used to smooth the turning off process such that the voltage stress across the devices in the driver is controlled within an safe operation area (SOA). As shown in FIG. 4, a first voltage clamping circuit 402 comprises a plurality of diodes. The first voltage clamping circuit 402 and a transistor PM4 are connected in series between CFH and the bulk terminal of SW3.

A second voltage clamping circuit 404 comprises a plurality of diodes. The second voltage clamping circuit 404 and a transistor PM2 are connected in parallel between VIN and a node FNW. PM2 is added to isolate the supply voltage bus of the driver from VIN. The supply voltage bus of the driver is denoted as FNW as shown in FIG. 4.

A third voltage clamping circuit 406 comprises a plurality of diodes. The third voltage clamping circuit 406 and a transistor PM5 are connected in series between FNW and FGND.

The first voltage clamping circuit 402 and the third voltage clamping circuit 406 are activated or deactivate by controlling switches PM4 and PM5, respectively. When the gate driver is enabled (or turned on), PM4 and PM5 are turned off to disengage the clamping circuits from the normal operation. When the driver is disabled (or turned off), PM4 and PM5 are turned on such that the rail-to-rail voltage across the driver (e.g., FNW-FGND) is not going to exceed the trigger voltage of the third voltage clamping circuit. The drain-to-bulk voltage of SW3 does not exceed its safe operation area in an case when CFH is shorted to VIN by any fault happened in the system.

Figure 5:
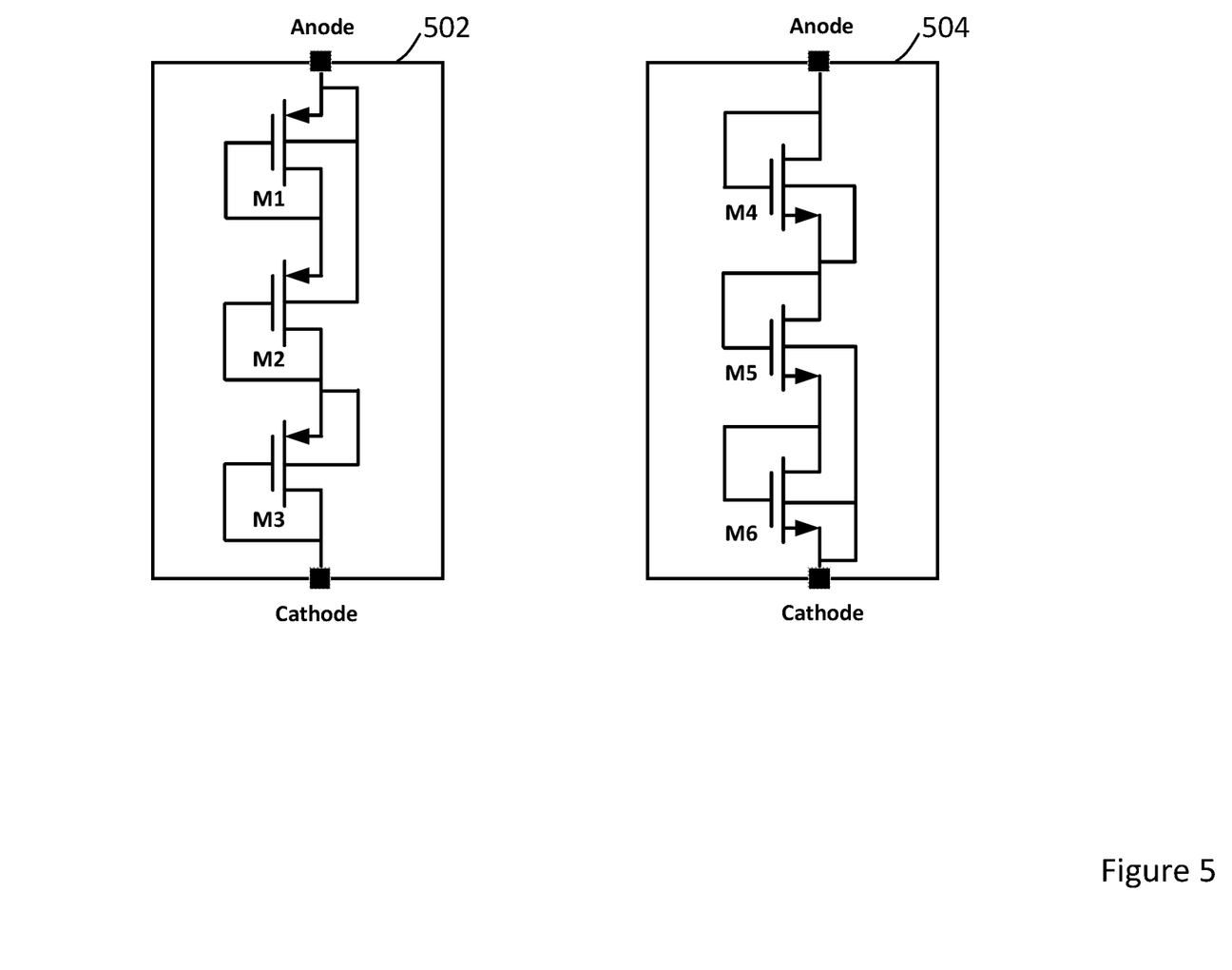
FIG. 5 illustrates two alternative implementations of the voltage clamp circuit shown in FIG. 4 in accordance with various embodiments of the present disclosure.

FIG. 5 illustrates two alternative implementations of the voltage clamp circuit shown in FIG. 4 in accordance with various embodiments of the present disclosure. There may be multiple implementations of the voltage clamping circuits shown in FIG. 4. Two alternative implementations are shown in FIG. 5. The number of devices placed in series in the clamping circuit can vary based on a specific SOA value. For example, for 5V devices used in the gate driver shown in FIG. 4, the clamping circuit may include three diodes or MOS transistors connected in series as shown in FIGS. 4-5. On the other hand, for 1.8V devices, the number of diodes or MOS transitor can be reduced to 1 or 2 in series.

As shown in FIG. 5, the voltage clamp circuit 502 comprises three p-type transistors M1, M2 and M3 connected in series between an anode and a cathode. Each of these three p-type transistors is configured as a diode. In particular, each transistor has a gate directly connected to its drain as shown in FIG. 5. The three p-type transistors are equivalent to three diodes connected in series (e.g., the first voltage clamping circuit 402 shown in FIG. 4).

The voltage clamp circuit 504 comprises three n-type transistors M4, M5 and M6 connected in series between an anode and a cathode. Each of these three n-type transistors is configured as a diode. In particular, each transistor has a gate directly connected to its drain as shown in FIG. 5. The three n-type transistors are equivalent to three diodes connected in series (e.g., the first voltage clamping circuit 402 shown in FIG. 4).

Figure 6:
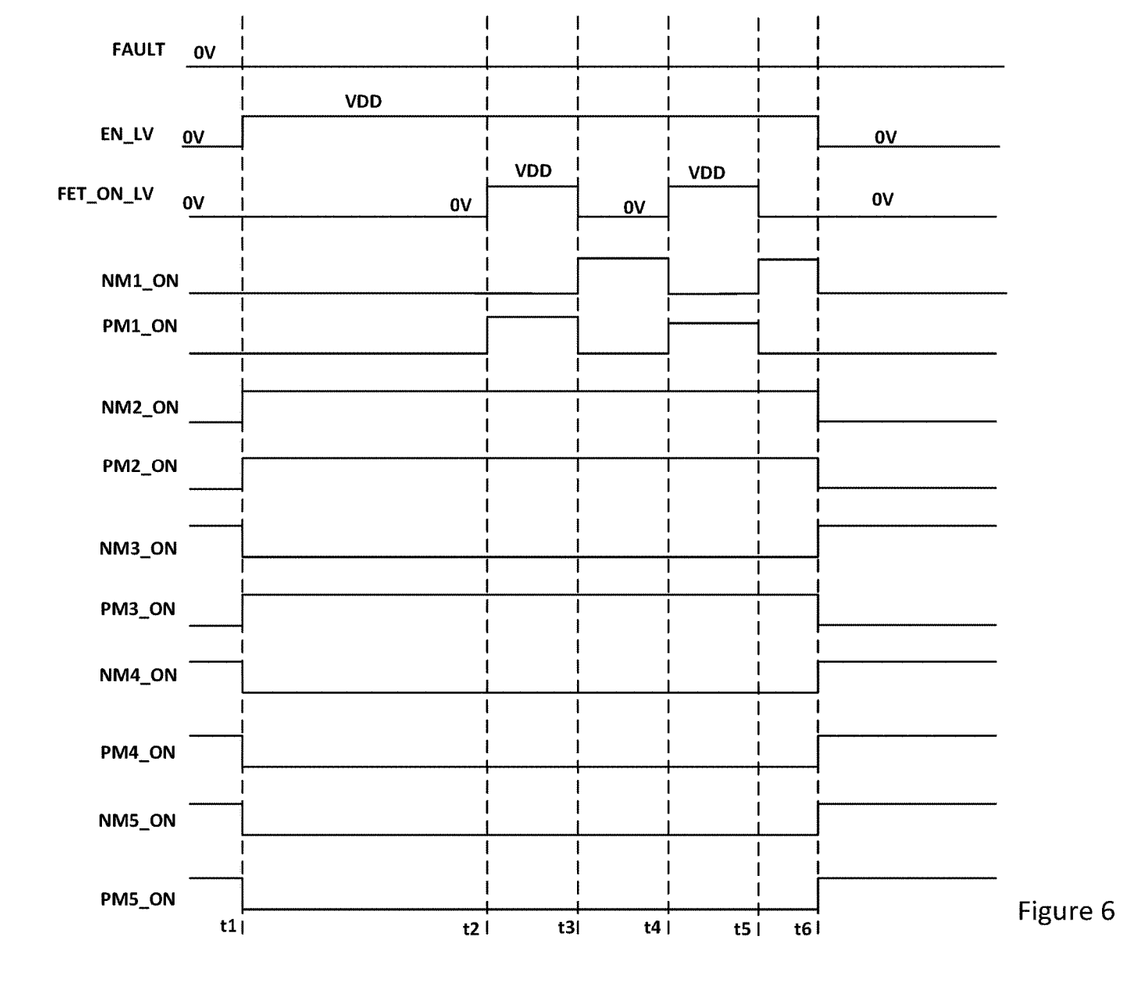
FIG. 6 illustrates a timing diagram of the gate driver shown in FIG. 4 in accordance with various embodiments of the present disclosure.

FIG. 6 illustrates a timing diagram of the gate driver shown in FIG. 4 in accordance with various embodiments of the present disclosure. The horizontal axis of FIG. 6 represents intervals of time. There are thirteen vertical axes. The first vertical axis represents a fault signal (FAULT). The second vertical axis represents the enable signal (EN_LV). The third vertical axis represents the gate drive signal (FET_ON_LV). The fourth vertical axis represents the on/off status of transistor NM1 (a logic high state indicates NM1 is turned on). The fifth vertical axis represents the on/off status of transistor PM1 (a logic high state indicates PM1 is turned on). The six vertical axis represents the on/off status of transistor NM2 (a logic high state indicates NM2 is turned on). The seventh vertical axis represents the on/off status of transistor PM2 (a logic high state indicates PM2 is turned on). The eighth vertical axis represents the on/off status of transistor NM3 (a logic high state indicates NM3 is turned on). The ninth vertical axis represents the on/off status of transistor PM3 (a logic high state indicates PM3 is turned on). The tenth vertical axis represents the on/off status of transistor NM4 (a logic high state indicates NM4 is turned on). The eleventh vertical axis represents the on/off status of transistor PM4 (a logic high state indicates PM4 is turned on). The twelfth vertical axis represents the on/off status of transistor NM5 (a logic high state indicates NM5 is turned on). The thirteenth vertical axis represents the on/off status of transistor PM5 (a logic high state indicates PM5 is turned on).

In FIG. 6, for transistors NM1-NM5 and PM1-PM5, a logic high state indicates that the corresponding transistor is turned on. A logic low state indicates the corresponding transistor is turned off. A leading edge of the fault signal indicates that a fault occurs in the system.

At the time instant t1, a leading edge of the enable signal EN_LV is applied to the gate driver. The logic high state of the enable signal indicates the switched capacitor converter is ready to be turned on. In response to the leading edge of the enable signal EN_LV, transistors NM2, PM2 and PM3 are turned on. Referring back to FIG. 4, after NM2 is turned on, VOUT is connected to the control logic ground FGND. After PM2 is turned on, the supply voltage bus of the gate driver is connected to VIN. After PM3 is turned on, the bulk terminal of SW3 is connected to the source of SW3. The switched capacitor converter is ready to be turned on.

After a predetermined delay, at the time instant t2, a leading edge of the gate drive signal FET_ON_LV is applied to the gate driver of SW3. The logic high state of the gate drive signal FET_ON_LV indicates that a high gate drive voltage is applied to the gate of SW3, and SW3 is turned on in response to this high gate drive voltage. As shown in FIG. 6, in response to the leading edge of the gate drive signal FET_ON_LV, transistors NM2, PM2 and PM3 remain on, and transistor PM1 is turned on. After transistor PM1 is turned on, a high gate drive voltage is applied to the gate of SW3. SW3 is turned on accordingly.

At the time instant t3, a falling edge of the gate drive signal FET_ON_LV is applied to the gate driver of SW3. The logic low state of the gate drive signal FET_ON_LV indicates that a low gate drive voltage is applied to the gate of SW3, and SW3 is turned off in response to this low gate drive voltage. As shown in FIG. 6, in response to the falling edge of the gate drive signal FET_ON_LV, transistors NM2, PM2 and PM3 remain on, and transistor NM1 is turned on.

After transistor NM1 is turned on, the gate of SW3 is shorted to the source of SW3. SW is turned off accordingly.

The on/off status of the transistors during the period from t4 to t5 is similar to that during the period from t2 to t3, and hence is not discussed again herein. At the time instant t6, a falling edge of the enable signal EN_LV is applied to the gate driver. The logic low state of the enable signal EN_LV indicates that the switched capacitor converter is ready to be turned off. As shown in FIG. 6, in response to the falling edge of the enable signal EN_LV, transistors NM1, PM1, NM2, PM2 and PM3 are turned off, and transistors NM3, NM4, PM4, NM5 and PM5 are turned on.

After transistor NM2 is turned off, the logic ground FGND is disconnected from VOUT. After PM3 is turned off, the bulk terminal of SW3 is disconnected from the source of SW3. After PM2 is turned off, the supply voltage bus of the driver is disconnected from VIN.

After transistor NM5 is turned on, the gate of SW3 is pulled down to the system ground. After transistor PM5 is turned on, the rail-to-rail voltage across the driver (FNW-FGND) is clamped to a voltage level less than the trigger voltage of the third voltage clamping circuit 406. After transistor PM4 is turned on, the drain-to-bulk voltage of SW3 does not exceed the SOA of SW3. After transistor NM3 is turned on, the bulk terminal of SW3 is pulled down to the system ground. After transistor NM4 is turned on, the control logic ground FGND is pulled down to the system ground.

Figure 7:
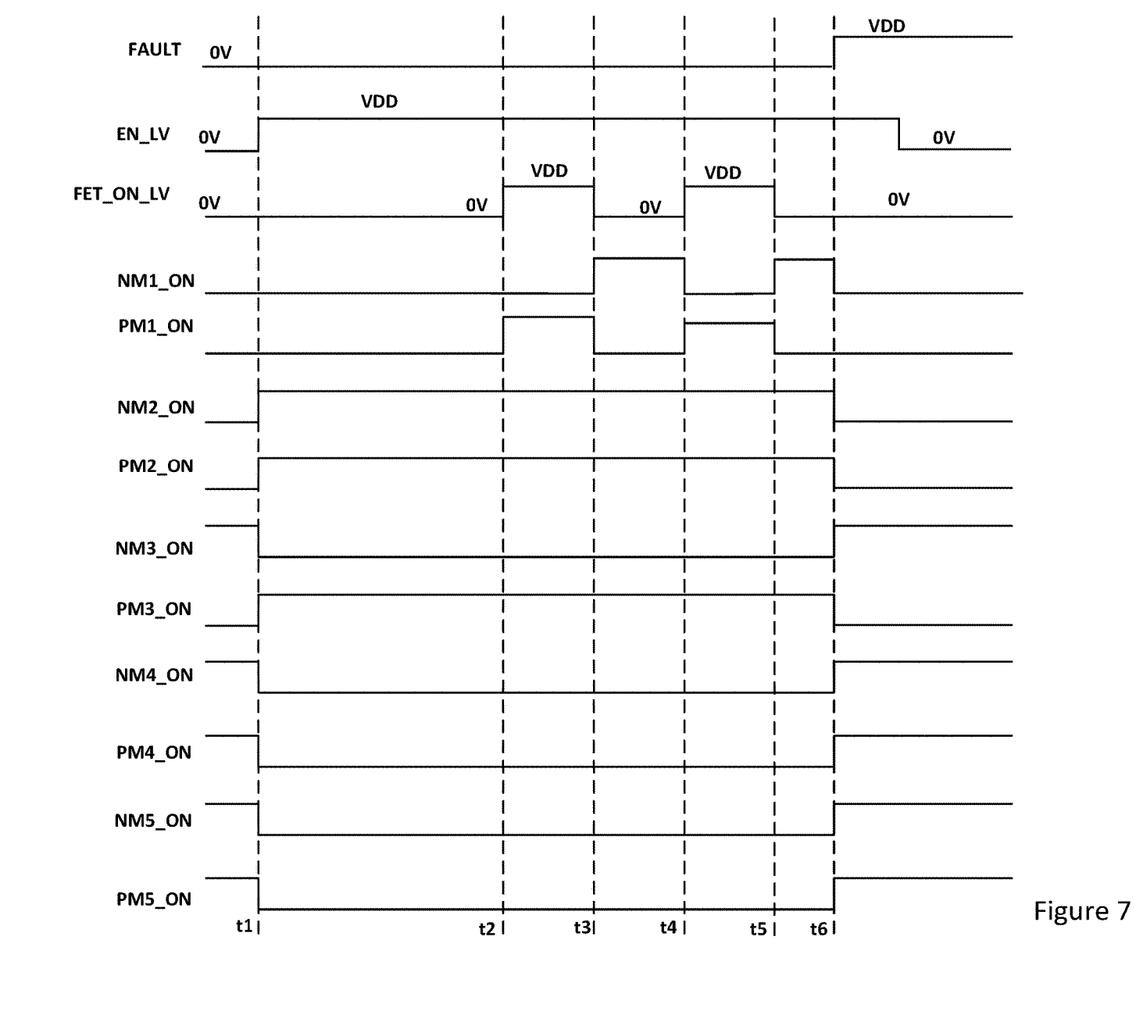
FIG. 7 illustrates a timing diagram of the gate driver after a fault has been detected in the switched capacitor converter in accordance with various embodiments of the present disclosure.

FIG. 7 illustrates a timing diagram of the gate driver after a fault has been detected in the switched capacitor converter in accordance with various embodiments of the present disclosure. The horizontal axis of FIG. 7 represents intervals of time. There are thirteen vertical axes. The first vertical axis represents the fault signal (FAULT). The second vertical axis represents the enable signal (EN_LV). The third vertical axis represents the gate drive signal (FET_ON_LV). The fourth vertical axis represents the on/off status of transistor NM1. The fifth vertical axis represents the on/off status of transistor PM1. The six vertical axis represents the on/off status of transistor NM2. The seventh vertical axis represents the on/off status of transistor PM2. The eighth vertical axis represents the on/off status of transistor NM3. The ninth vertical axis represents the on/off status of transistor PM3. The tenth vertical axis represents the on/off status of transistor NM4. The eleventh vertical axis represents the on/off status of transistor PM4. The twelfth vertical axis represents the on/off status of transistor NM5. The thirteenth vertical axis represents the on/off status of transistor PM5. In FIG. 7, for transistors NM1-NM5 and PM1-PM5, a logic high state indicates the corresponding transistor is turned on. A logic low state indicates the corresponding transistor is turned off.

The timing diagram shown in FIG. 7 is similar to that shown in FIG. 6 except that after detecting a fault (a leading edge of the fault signal), the driver enters into an off state before the disable signal is applied to the driver.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a first gate drive transistor and a second gate drive transistor connected in series, a common node of the first gate drive transistor and the second gate drive transistor being connected to a gate of a power switch, the second gate drive transistor being configured as a bulk switch having a bulk terminal connected to a bulk terminal of the power switch;
a first auxiliary transistor connected between the bulk terminal and a source of the power switch;
a second auxiliary transistor coupled between the gate of the power switch and a system ground; and
a third auxiliary transistor coupled between a logic control ground and the system ground, wherein the second auxiliary transistor and the third auxiliary transistor are configured to pull the gate of the power switch and the logic control ground down to the system ground in response to a turn off of the apparatus.

2. The apparatus of claim 1, wherein:
the apparatus is turned off upon receiving a disable signal or detecting a fault.

3. The apparatus of claim 1, wherein the power switch is an isolation switch including two diodes, and wherein:
a first diode is between the bulk terminal and the source of the power switch; and
a second diode is between the bulk terminal and a drain of the power switch, and wherein the two diodes are back-to-back connected.

4. The apparatus of claim 1, further comprising:
a fourth auxiliary transistor coupled between the source of the power switch and the logic control ground, wherein in response to the turn off of the apparatus, the fourth auxiliary transistor is turned off to separate the source of the power switch from the logic control ground.

5. The apparatus of claim 1, wherein:
in response to the turn off of the power switch, the first auxiliary transistor is turned off to separate the bulk terminal of the power switch from the source of the power switch.

6. The apparatus of claim 1, further comprising:
a fifth auxiliary transistor connected between the bulk terminal and the system ground, wherein in response to the turn off of the apparatus, the fifth auxiliary transistor is turned on to pull the bulk terminal of the power switch down to the system ground.

7. The apparatus of claim 1, wherein:
the power switch is a third switch of a switched capacitor power converter, and wherein the power switch is connected between an output terminal of the switched capacitor power converter and a flying capacitor.

8. The apparatus of claim 7, wherein the switched capacitor power converter comprises:
a first switch, a second switch, the third switch and a fourth switch connected in series between the system ground and an input voltage bus; and
the flying capacitor connected between a common node of the first switch and the second switch, and a common node of the third switch and the fourth switch.

9. A method for controlling a driver configured to generate a gate drive signal for a power switch, the method comprising:
after enabling the driver, connecting a source of the power switch to a logic control ground of the driver, and connecting a bulk terminal of the power switch to the source of the power switch; and
after disabling the driver, disconnecting the source of the power switch from the logic control ground of the driver, and disconnecting the bulk terminal of the power switch from the source of the power switch.

10. The method of claim 9, further comprising:
after enabling the driver, connecting a supply voltage bus of the driver to an input voltage bus; and
after disabling the driver, disconnecting the supply voltage bus of the driver from the input voltage bus.

11. The method of claim 9, further comprising:
after disabling the driver, connecting the bulk terminal of the power switch, a gate of the power switch and the logic control ground to a system ground.

12. The method of claim 9, wherein the power switch is a third switch of a switched capacitor power converter comprising:
a first switch, a second switch, the third switch and a fourth switch connected in series between a system ground and an input voltage bus; and
a flying capacitor connected between a common node of the first switch and the second switch, and a common node of the third switch and the fourth switch.

13. The method of claim 9, further comprising:
after disabling the driver, activating a first voltage clamp to limit a voltage across a drain and the bulk terminal of the power switch, and activating a second voltage clamp to limit a voltage across two supply buses of the driver.

14. The method of claim 9, further comprising:
upon detecting a fault or receiving a disable signal, disabling the driver.

15. A system comprising:
a switched capacitor converter; and
a driver configured to drive a third switch of the switched capacitor converter, wherein the driver comprises:
a first gate drive transistor and a second gate drive transistor connected in series, a common node of the first gate drive transistor and the second gate drive transistor being connected to a gate of the third switch, the second gate drive transistor being configured as a bulk switch having a bulk terminal connected to a bulk terminal of the third switch;
a first auxiliary transistor connected between the bulk terminal and a source of the third switch;
a second auxiliary transistor coupled between a gate of the third switch and a system ground; and
a third auxiliary transistor coupled between a logic control ground and the system ground, wherein the second auxiliary transistor and the third auxiliary transistor are configured to pull the gate of the third switch and the logic control ground down to the system ground in response to a turn off of the driver.

16. The system of claim 15, wherein the switched capacitor converter comprises:
a first switch, a second switch, the third switch and a fourth switch connected in series between the system ground and an input voltage bus; and a flying capacitor connected between a common node of the first switch and the second switch, and a common node of the third switch and the fourth switch.

17. The system of claim 15, further comprising:
a fourth auxiliary transistor coupled between the source of the third switch and the logic control ground, wherein in response to the turn off of the driver, the fourth auxiliary transistor is turned off to separate the source of the third switch from the logic control ground.

18. The system of claim 15, further comprising:
a fifth auxiliary transistor and a discharge resistor connected in series between the bulk terminal and the system ground, wherein in response to the turn off of the driver, the fifth auxiliary transistor is turned on to pull the bulk terminal of the third switch down to the system ground.

19. The system of claim 15, further comprising:
a first voltage clamp coupled between a drain and the bulk terminal of the third switch;
a second voltage clamp coupled between an input voltage bus and a supply voltage bus of the driver; and
a third voltage clamp coupled between the supply voltage bus and the logic control ground, wherein the first voltage clamp, the second voltage clamp and the third voltage clamp are activated in response to the turn off of the driver or a fault occurred in the system.

20. The system of claim 15, wherein:
the driver is turned off upon receiving a disable signal or detecting a fault in the system.

* * * * *